United States Patent
Escobar-Bowser et al.

(10) Patent No.: US 6,542,032 B2
(45) Date of Patent: Apr. 1, 2003

(54) EXTREMELY LINEAR, HIGH SPEED, CLASS AB RAIL TO RAIL BIPOLAR AMPLIFIER OUTPUT STAGE WITH HIGH OUTPUT DRIVE

(75) Inventors: Priscilla Escobar-Bowser, Plano, TX (US); Maria F. Carreto, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 52 days.

(21) Appl. No.: 09/995,905

(22) Filed: Nov. 28, 2001

(65) Prior Publication Data

US 2002/0101286 A1 Aug. 1, 2002

Related U.S. Application Data

(60) Provisional application No. 60/250,594, filed on Dec. 1, 2000.

(51) Int. Cl.[7] .................................................. H03F 3/45
(52) U.S. Cl. ........................ 330/255; 330/263; 330/292
(58) Field of Search ................................. 330/255, 263, 330/265, 267, 292

(56) References Cited

U.S. PATENT DOCUMENTS

| | | | |
|---|---|---|---|
| 4,857,861 A | * | 8/1989 | Seevinck et al. ........... 330/255 |
| 5,512,859 A | * | 4/1996 | Moraveji ..................... 330/267 |
| 5,798,673 A | * | 8/1998 | Griffith et al. .............. 330/255 |

\* cited by examiner

Primary Examiner—Henry Choe
(74) Attorney, Agent, or Firm—Alan K. Stewart; W. James Brady, III; Frederick J. Telecky, Jr.

(57) ABSTRACT

The amplifier output stage circuit includes: a translinear loop 30 having first and second input nodes Vin+ and Vin−; a first transistor Q7 coupled between a first output node of the translinear loop 30 and a first supply node V+; a first output transistor Q9 coupled between an output node 36 of the circuit and the first supply node V+, and having a base coupled to a base of the first transistor Q7; a second transistor Q10 coupled between a second output node of the translinear loop 30 and a second supply node V−; a second output transistor Q12 coupled between the output node 36 of the circuit and the second supply node V−, and having a base coupled to a base of the second transistor Q10.

12 Claims, 3 Drawing Sheets

EXTREMELY LINEAR, HIGH SPEED, CLASS AB RAIL TO RAIL BIPOLAR AMPLIFIER OUTPUT STAGE WITH HIGH OUTPUT DRIVE

This application claims priority under 35 USC § 119 (e) (1) of provisional application No. 60/250,594 filed Dec. 1, 2000.

FIELD OF THE INVENTION

This invention generally relates to electronic systems and in particular it relates to an extremely linear, high speed, class AB rail to rail bipolar amplifier output stage with high output drive.

BACKGROUND OF THE INVENTION

As technology progresses into lower power, higher speed logic circuits, the challenges of operating analog circuits at lower power supply voltages is imminent. As a result, system designers prefer to utilize Operational Amplifiers that allow them to obtain the maximum input/output dynamic range from a given set of power supplies. This, added to the fact that gaining up an amplifier requires external resistors, gains up undesired performance (i.e., noise, offset and others) and slows down the amplifier. This is why Rail to Rail Input/Output amplifiers are becoming so popular. These, added to the low power requirements, makes the Class AB Rail to Rail Op Amps very desirable. Both flavors: high accuracy MOS applications and high drive/speed bipolar solutions are currently in high demand.

The Rail to Rail Op Amp output stage does not come without penalties. Rail to Rail operation is achieved by having a very simple output stage typically made out of a couple of output transistors connected in a common emitter or a common source configuration together with their required biasing circuitry, such as the prior art circuit shown in FIG. 1. This type of opamp is inherently slower due to the high gain output stage. Also, due to the high output impedance and the typical asymmetrical and independent biasing of the output transistors 10 and 12, dc and cross-over distortion sharply degrades when compared with the common collector/drain counterpart class AB output stages. Degradation worsens when driving a heavy load. The output transistors 10 and 12 have independent translinear loops 14 and 16 linearizing them. Linearization is strictly base current dependent. The result is poor DC and time dependent (AC) linearity. The impedance at the base of output transistors 10 and 12 increases as drive increases. This makes the circuit hard to compensate because the poles at output node 18 and at the base of output transistors 10 and 12 move towards each other becoming complex conjugate poles at high drive. Also, the maximum sourcing and sinking capability is limited by the input currents $I_{in+}$ and $I_{in-}$ generated by an input stage.

SUMMARY OF THE INVENTION

An amplifier output stage circuit includes: a translinear loop having first and second input nodes; a first transistor coupled between a first output node of the translinear loop and a first supply node; a first output transistor coupled between an output node of the circuit and the first supply node, and having a base coupled to a base of the first transistor; a second transistor coupled between a second output node of the translinear loop and a second supply node; a second output transistor coupled between the output node of the circuit and the second supply node, and having a base coupled to a base of the second transistor.

DETAILED DESCRIPTION OF PREFERRED EMBODIMENTS

To mitigate the problems encountered in the prior art, the output stage must be driven with a common signal (preferably differential) and have a common class AB biasing circuitry that linearizes the two output transistors simultaneously in a common translinear loop. Also, bipolar output stages need to account for the extra base drive of the output transistors, especially during heavy loads. In other words, the most desired bipolar Rail to Rail output stage must be driven with a common signal, have symmetrical signal paths, have a common class AB translinear loop that linearizes the output transistors, and account for heavy loads with a very high drive while operating at a very low quiescent current. Additionally, with any amplifier design, the inputs should have very high input impedance in order to prevent overloading the driving stage. The prior art solutions do not achieve simultaneously these requirements.

Figure 1:
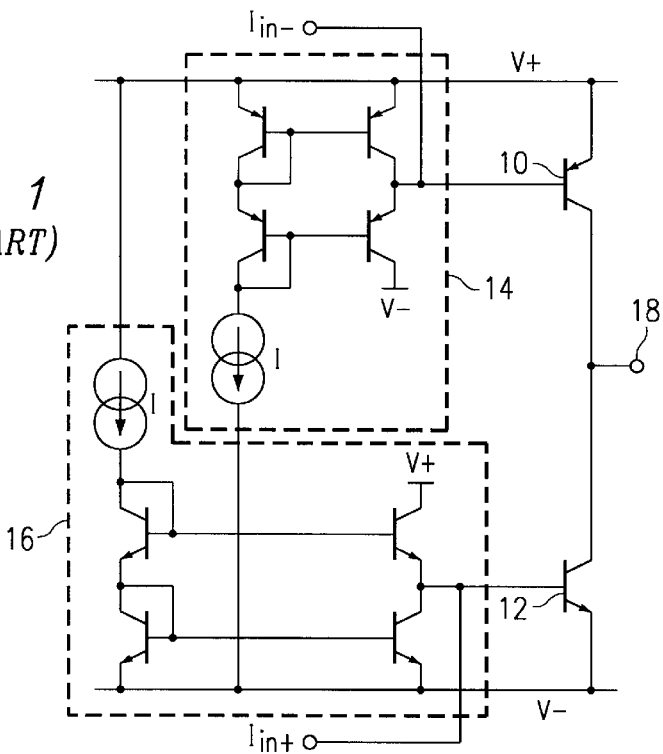
FIG. 1 is a schematic circuit diagram of a prior art operational amplifier output stage.
Figure 2:
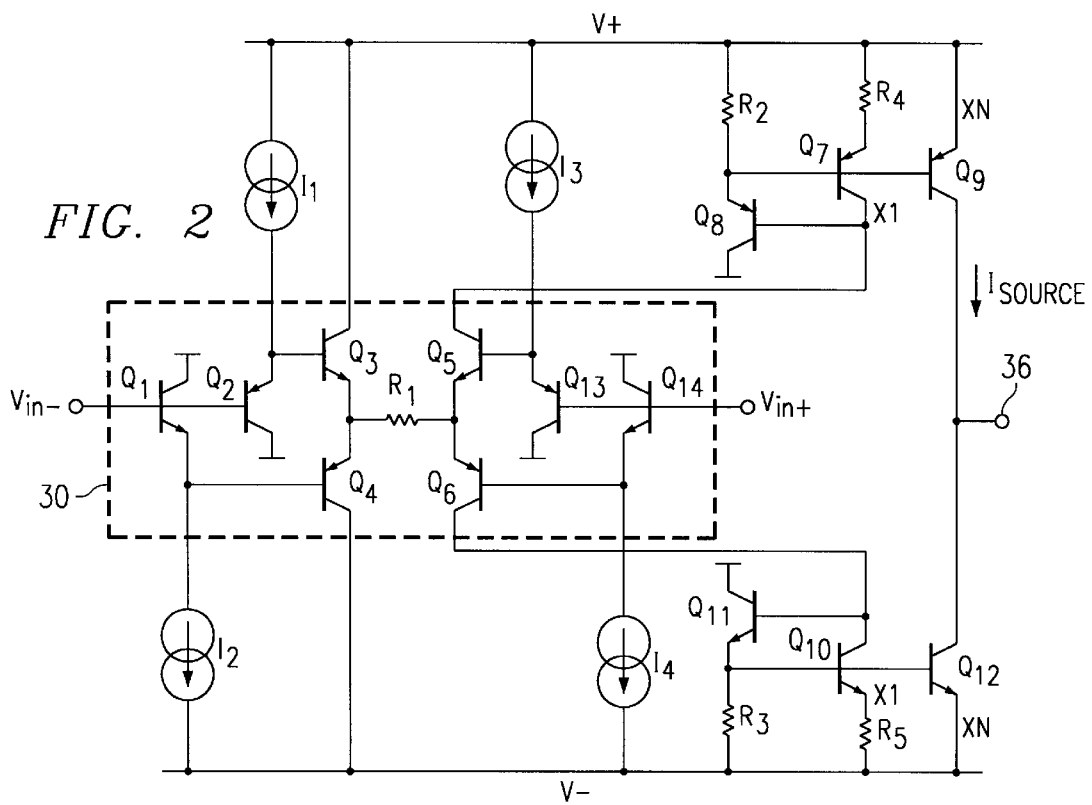
FIG. 2 is a schematic circuit diagram of a preferred embodiment amplifier output stage.

The preferred embodiment Class AB Rail to Rail bipolar output stage, shown in FIG. 2, achieves extremely low distortion, when compared with the prior art, by having a single translinear loop linearizing the output transistors, having symmetrical drive to those, exhibiting high input impedance, while being capable of providing a substantially large current drive to the output node. The circuit of FIG. 2 includes: translinear loop 30 which includes NPN transistors Q1, Q3, Q5, and Q14, PNP transistors Q2, Q4, Q6, and Q13, and resistor R1; PNP transistors Q7, Q8, and Q9; NPN transistors Q10, Q11, and Q12; current sources I1–I4; resistors R2–R5; differential inputs Vin+ and Vin−; source voltages V+ and V−; and output node 36. Resistor R2 and transistor Q8 form a Darlington drive for the base of transistors Q7 and Q9. The Darlington drive compensates for base current errors between transistors Q5, Q7, and Q9 so that the ratio of the base-to-emitter voltage of transistor Q5 to that of transistors Q7 and Q9 is more exact. Resistor R3 and transistor Q11 form a Darlington drive for the base of transistors Q10 and Q12. The ratio of transistor Q9 to transistor Q7 is N:1. The ratio of transistor Q12 to transistor Q10 is N:1. Resistor R1 determines the gain of the differential input signal. Smaller values of R1 gives more voltage gain. Resistors R4 and R5 are optional resistors that provide higher drive capability to transistors Q9 and Q12 with less drive current from current sources I3 and I4.

The preferred embodiment circuit of FIG. 2 is very linear. Transistors Q5 and Q6 linearize output transistors Q9 and Q12, respectively. This linearization is base current independent due to the presence of transistors Q8 and Q11 in the circuit. The circuit of FIG. 2 also has high driving capability, as shown by the following equations:

for $R_4 = 0$; $I_{source_{max}} = I_3 \cdot \beta_{Q5} \cdot N$ for $R_4 \neq 0$; $I_{source(max)} = I_3 B_{Q5} \dfrac{I_{SQ9}}{I_{SQ7}} \cdot N \cdot e^{\dfrac{I_3 \cdot \beta_{Q5} \cdot R_4}{VT}}$ Where $\beta_{Q5}$ is the beta of transistor Q5, $I_{SQ9}$ is the source current in transistor Q9, $I_{SQ7}$ is the source current in transistor Q7, and VT is the transistor threshold voltage.

The circuit of FIG. 2 provides high input impedance looking into the base of transistors Q1, Q2, Q13, and Q14. The circuit of FIG. 2 provides simpler compensation. The impedance at the base of transistor Q7 goes down during hard sourcing. Also the impedance of transistor Q9 goes down during that condition. This causes both poles to move in the same direction and to higher frequencies. In the same way, when sinking, transistors Q10 and Q12 cause the poles to move to higher frequencies. In the prior art, the poles moved towards each other, making the circuit prone to gain peaking instability. The differential drive of the circuit of FIG. 2 allows for higher speed and larger small signal voltage gain which provides better linearity.

Figure 3:
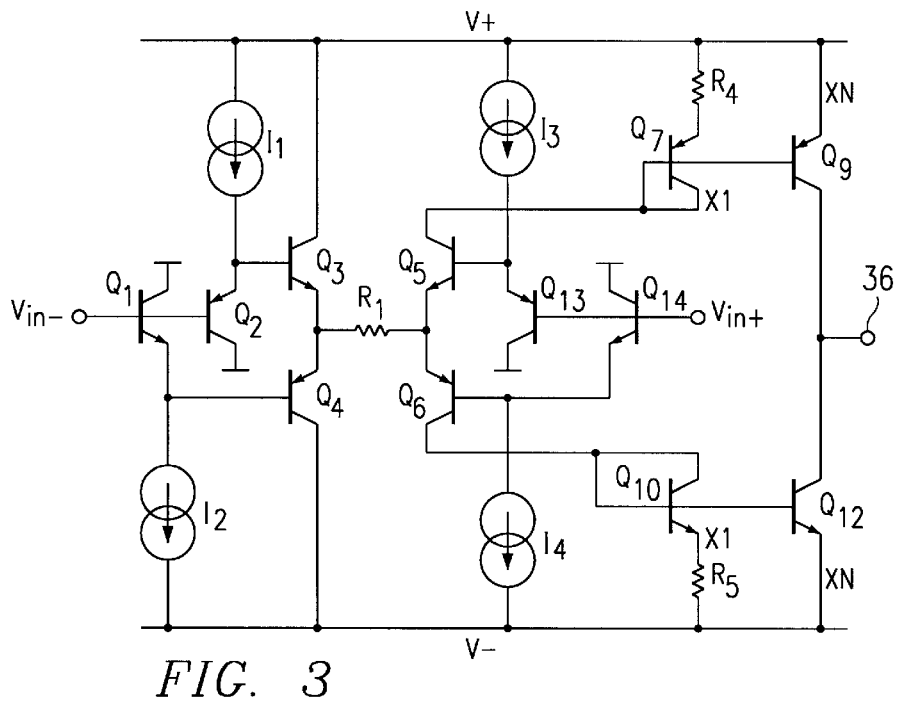
FIG. 3 is a schematic circuit diagram of a first alternative embodiment amplifier output stage.

A first alternative embodiment is shown in FIG. 3. This circuit is a simpler variation of the circuit of FIG. 2, with the Darlington drives provided by resistors R2 and R3 and transistors Q8 and Q11 in FIG. 2 removed from the circuit of FIG. 3. This circuit provides better performance at high frequencies than the circuit of FIG. 2, but at high output drive, the linearization could become βpnp vs. βnpn dominated. (βpnp is the beta of the PNP transistors and βnpn is the beta of the NPN transistors.) To mitigate this, the base currents of the output transistors Q9 and Q12 at high drive need to be small when compared to the current of transistors Q7 and Q10.

Figure 4:
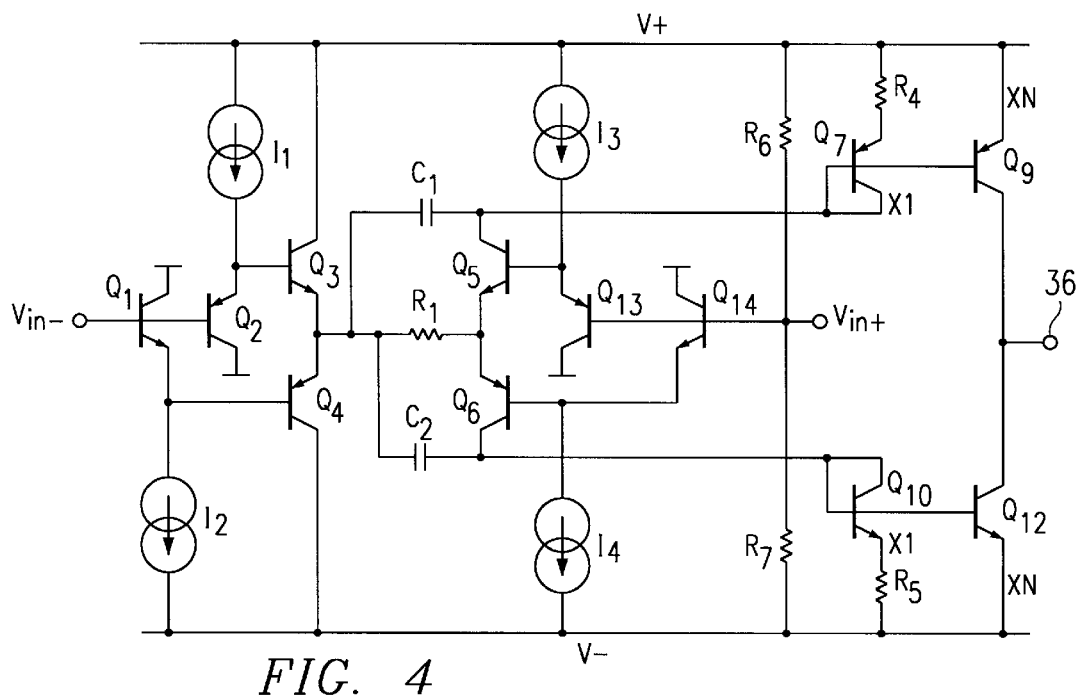
FIG. 4 is a schematic circuit diagram of a second alternative embodiment amplifier output stage.

A second alternative embodiment is shown in FIG. 4. The circuit of FIG. 4 is a single ended version of the circuit of FIG. 3. In FIG. 4, the node Vin+ is biased by a voltage divider formed by resistors R6 and R7. The other difference from the circuit of FIG. 3 is the addition of capacitors C1 and C2. These capacitors speed up the output stage at high frequencies. While this has some negative impact on linearity, this is not a problem for the high frequency signals. The single ended operation of FIG. 2 is easily achieved due to the high input impedance of transistor Q4. Due to the high gain (voltage) of the output stage, any DC voltage present at the input of the previous stage will show up at node Vin− as VDC/Ao (Ao is the gain of the output stage), i.e., less than 15 mV for a 30V power supply and Ao of 60 dB, causing an insignificant current offset in the translinear loop formed by transistors Q1, Q2, Q3, Q4, Q5, Q6, Q13 and Q14. Resistor R1 typically is set to a small value such as 100–200 ohms.

Figure 5:
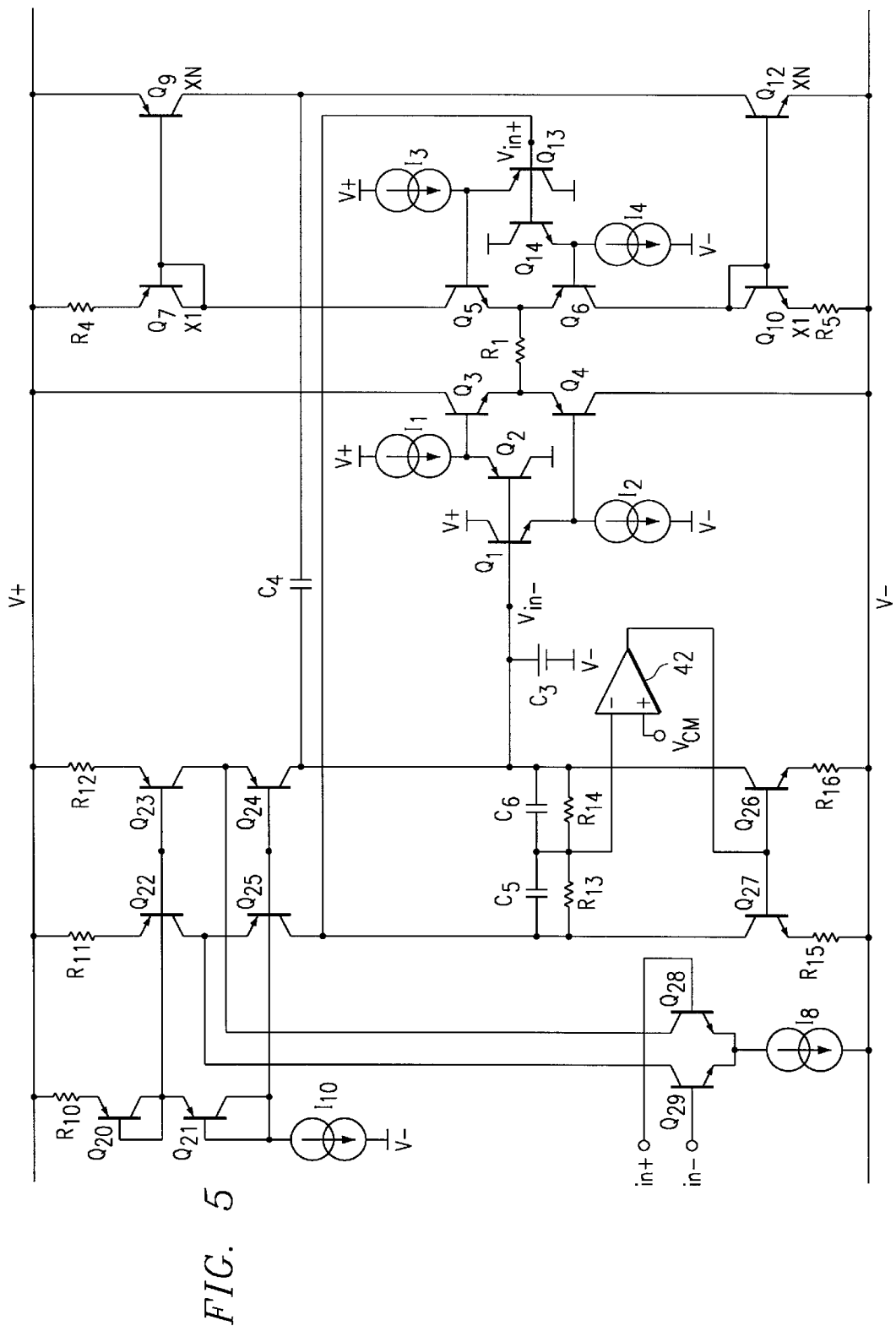
FIG. 5 is a schematic circuit diagram of a full Op Amp implementation utilizing the output stage of FIG. 3.

The circuit of FIG. 5 is an example of a full Op Amp implementation utilizing the output stage of FIG. 3. The circuit of FIG. 5 includes the output stage of FIG. 3 coupled to an input stage. The input stage includes transistors Q20–Q29; current sources I8 and I10; amplifier 42; capacitors C3–C6; resistors R10–R16; input nodes IN+ and IN−; and amplifier input node Vcm. Input stage 40 provides the inputs to the output stage at nodes Vin+ and Vin−.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, some of the bipolar transistors could be replaced with MOS transistors. It is therefore intended that the appended claims encompass any such modifications or embodiments.

What is claimed is:

1. A circuit comprising:
   a translinear loop having first and second input nodes;
   a first transistor coupled between a first output node of the translinear loop and a first supply node;
   a first output transistor coupled between an output node of the circuit and the first supply node, and having a base coupled to a base of the first transistor;
   a second transistor coupled between a second output node of the translinear loop and a second supply node;
   a second output transistor coupled between the output node of the circuit and the second supply node, and having a base coupled to a base of the second transistor;
   a first resistor coupled between an emitter of the first transistor and the first supply node; and
   a second resistor coupled between an emitter of the second transistor and the second supply node.

2. The circuit of claim 1 wherein the first transistor and the first output transistor are PNP transistors, and the second transistor and the second output transistor are NPN transistors.

3. The circuit of claim 1 further comprising:
   a first Darlington drive coupled to the first transistor; and
   a second Darlington drive coupled to the second transistor.

4. The circuit of claim 1 further comprising:
   a third transistor having a base coupled to a collector of the first transistor and an emitter coupled to a base of the first transistor;
   a first resistor coupled between the base of the first transistor and the first supply node;
   a fourth transistor having a base coupled to a collector of the second transistor and an emitter coupled to a base of the second transistor; and
   a second resistor coupled between the base of the second transistor and the second supply node.

5. The circuit of claim 4 wherein the third transistor is a PNP transistor and the fourth transistor is an NPN transistor.

6. The circuit of claim 1 wherein a base and a collector of the first transistor are coupled to the first output node of the translinear loop, and a base and a collector of the second transistor are coupled to the second output node of the translinear loop.

7. The circuit of claim 1 wherein the translinear loop comprises:
   a third transistor having a base coupled to the first input node;
   a fourth transistor having a base coupled to the third transistor, the fourth transistor is coupled to the first output node of the translinear loop;
   a fifth transistor having a base coupled to the first input node;
   a sixth transistor coupled in series with the fourth transistor and having a base coupled to the fifth transistor, the sixth transistor is coupled to the second output node of the translinear loop;
   a seventh transistor having a base coupled to the second input node;
   an eighth transistor having a base coupled to the seventh transistor;
   a ninth transistor having a base coupled to the second input node;
   a tenth transistor coupled in series with the eighth transistor and having a base coupled to the ninth transistor; and a first resistor having a first end coupled to the fourth and sixth transistors and a second end coupled to the eighth and tenth transistors.

8. The circuit of claim 7 further comprising:

a first current source coupled to the third transistor;

a second current source coupled to the fifth transistor;

a third current source coupled to the seventh transistor; and a fourth current source coupled to the ninth transistor.

9. The circuit of claim 7 wherein the third, sixth, seventh, and tenth transistors are PNP transistors, and the fourth, fifth, eighth, and ninth transistors are NPN transistors.

10. The circuit of claim 7 further comprising a voltage divider coupled to the second input node.

11. The circuit of claim 10 further comprising:

a first capacitor coupled between the first end of the first resistor and the first transistor; and a second capacitor coupled between the first end of the first resistor and the second transistor.

12. The circuit of claim 10 wherein the voltage divider comprises:

a second resistor coupled between the second input node and the first supply node; and a third resistor coupled between the second input node and the second supply node.

* * * * *